United States Patent
Dubin

(10) Patent No.: US 7,476,967 B2
(45) Date of Patent: Jan. 13, 2009

(54) COMPOSITE CARBON NANOTUBE THERMAL INTERFACE DEVICE

(75) Inventor: Valery M. Dubin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 289 days.

(21) Appl. No.: 11/360,096

(22) Filed: Feb. 22, 2006

(65) Prior Publication Data

US 2007/0102809 A1  May 10, 2007

Related U.S. Application Data

(62) Division of application No. 10/607,525, filed on Jun. 25, 2003, now Pat. No. 7,112,472.

(51) Int. Cl.
| | |
|---|---|
| H01L 23/34 | (2006.01) |
| H01L 23/10 | (2006.01) |
| H01L 23/28 | (2006.01) |
| H01L 23/495 | (2006.01) |
| H01L 29/06 | (2006.01) |
| H01L 29/80 | (2006.01) |
| H01L 23/48 | (2006.01) |
| H01L 29/47 | (2006.01) |

(52) U.S. Cl. .................. 257/706; 257/276; 257/475; 257/625; 257/675; 257/717; 257/720; 257/796

(58) Field of Classification Search .................. None
See application file for complete search history.

(56) References Cited

U.S. PATENT DOCUMENTS

| | | | |
|---|---|---|---|
| 5,780,101 A | 7/1998 | Nolan et al. | |
| 5,965,267 A | 10/1999 | Nolan et al. | |
| 6,129,901 A * | 10/2000 | Moskovits et al. | 423/447.3 |
| 6,156,256 A | 12/2000 | Kennel | |
| 6,250,984 B1 * | 6/2001 | Jin et al. | 445/51 |
| 6,283,812 B1 | 9/2001 | Jin et al. | |
| 6,303,094 B1 | 10/2001 | Kusunoki et al. | |
| 6,325,909 B1 | 12/2001 | Li et al. | |
| 6,350,488 B1 | 2/2002 | Lee et al. | |
| 6,361,861 B2 | 3/2002 | Gao et al. | |
| 6,383,923 B1 | 5/2002 | Brown et al. | |

(Continued)

FOREIGN PATENT DOCUMENTS

DE  003318729  * 11/1984

(Continued)

OTHER PUBLICATIONS

Kyotani, Preparation of ultrafine carbon tubes in nanochannels of an anodic aluminum oxide film, Chemistry of Materials, vol. 8, Issue 8, 1996.*

(Continued)

Primary Examiner—Carl Whitehead, Jr.
Assistant Examiner—James M Mitchell
(74) Attorney, Agent, or Firm—Kenneth A. Nelson

(57) ABSTRACT

Embodiments of a composite carbon nanotube structure comprising a number of carbon nanotubes disposed in a matrix comprised of a metal or a metal oxide. The composite carbon nanotube structures may be used as a thermal interface device in a packaged integrated circuit device.

8 Claims, 12 Drawing Sheets

U.S. PATENT DOCUMENTS

| | | | |
|---|---|---|---|
| 6,407,922 | B1 | 6/2002 | Eckblad et al. |
| 6,420,293 | B1 | 7/2002 | Chang et al. |
| 6,440,761 | B1 | 8/2002 | Choi |
| 6,445,006 | B1 | 9/2002 | Brandes et al. |
| 6,495,258 | B1 | 12/2002 | Chen et al. |
| 6,528,020 | B1 | 3/2003 | Dai et al. |
| 6,531,828 | B2 | 3/2003 | Yaniv et al. |
| 6,628,053 | B1 | 9/2003 | Den et al. |
| 6,652,958 | B2 * | 11/2003 | Tobita ............... 428/298.1 |
| 6,737,939 | B2 | 5/2004 | Hoppe et al. |
| 6,741,019 | B1 * | 5/2004 | Filas et al. ............ 313/355 |
| 6,856,016 | B2 * | 2/2005 | Searls et al. ........... 257/720 |
| 6,867,492 | B2 * | 3/2005 | Auburger et al. ........ 257/706 |
| 6,891,724 | B2 * | 5/2005 | De Lorenzo et al. ..... 361/704 |
| 6,919,119 | B2 * | 7/2005 | Kalkan et al. .......... 428/119 |
| 6,921,975 | B2 * | 7/2005 | Leal et al. ............ 257/723 |
| 6,924,335 | B2 * | 8/2005 | Fan et al. ............. 524/495 |
| 6,965,513 | B2 * | 11/2005 | Montgomery et al. ..... 361/687 |
| 6,994,584 | B1 * | 2/2006 | Santana et al. ........ 439/485 |
| 2001/0009693 | A1 | 7/2001 | Lee et al. |
| 2001/0024633 | A1 | 9/2001 | Lee et al. |
| 2002/0172767 | A1 | 11/2002 | Grigorian et al. |
| 2002/0197752 | A1 | 12/2002 | Choi |
| 2003/0064169 | A1 | 4/2003 | Hong et al. |
| 2003/0143382 | A1 * | 7/2003 | Xu ..................... 428/209 |
| 2004/0005736 | A1 * | 1/2004 | Searls et al. .......... 438/122 |
| 2004/0017656 | A1 * | 1/2004 | Lee et al. ............. 361/687 |
| 2004/0124526 | A1 * | 7/2004 | Matayabas et al. ...... 257/712 |
| 2004/0137730 | A1 | 7/2004 | Kim et al. |
| 2004/0150100 | A1 * | 8/2004 | Dubin et al. .......... 257/720 |
| 2004/0266065 | A1 | 12/2004 | Zhang et al. |
| 2006/0017069 | A1 * | 1/2006 | Bergmann et al. ....... 257/212 |

FOREIGN PATENT DOCUMENTS

| | | | |
|---|---|---|---|
| EP | 0253295 | * | 1/1988 |

OTHER PUBLICATIONS

Gras, "Template synthesis of carbon nanotubes from porous alumina matrix on silicon", Microelectronics Engineering, p. 2432-2436, 2006.*

Xiao, "Fabrication of Alumina Nantubes and Nanowires by etching Porous Alumina Membranes", Nan Letter, vol. 2, No. 11 p. 1293-1297.*

Valery M. Dubin et al., "Packaging of Integrated Circuits With Carbon Nano-Tube Arrays to Enhance Heat Dissipation Through a Thermal Interface", U.S. Appl. No. 10/357,927, filed Feb. 3, 2003, 28 pages.

J. Li et al., "Highly-Ordered Carbon Nanotube Arrays for Electronics Applications", *Applied Physics Letters*, vol. 75, No. 3, Jul. 19, 1999, American Institute of Physics, pp. 367-369.

B.Q. Wei et al., "Organized Assembly of Carbon Nanotubes", *Nature*, vol. 416, Apr. 4, 2002, Macmillan Magazines Ltd., pp. 495-496.

C. Papadopoulos et al., "Electronic Transport in Y-Junction Carbon Nanotubes", *Physical Review Letters*, vol. 85, No. 16, Oct. 16, 2000, The American Physical Society, pp. 3476-3479.

Li et al., "Growing Y-Junction Carbon Nanotubes", *Nature*, vol. 402, Nov. 18, 1999, Macmillan Magazines Ltd., pp. 253-254.

Jie Liu et al., "Fullerene Pipes", *Science*, vol. 280, May 22, 1998, pp. 1253-1256.

Avouris et al., "Carbon Nanotube Electronics", Abstract No. 52, *Philadelphia Meeting Abstracts*, vol. 2002-1, 201st Meeting of the Electrochemical Society, Philadelphia, PA, May 2002, 3 pg.

Zhang et al., "Substrate-Site Selective Growth of Aligned Carbon Nanotubes", *Applied Physics Letters*, vol. 77, No. 23, Dec. 4, 2000, American Institute of Physics, pp. 3764-3766.

Bower et al, "Plasma-Induced Alignment of Carbon Nanotubes", *Applied Physics Letters*, vol. 77, No. 6, Aug. 7, 2000, American Institute of Physics, pp. 830-832.

Fan et al., "Self-Oriented Regular Arrays of Carbon Nanotubes and Their Field Emission Properties", *Science*, vol. 283, Jan. 22, 1999, pp. 512-514.

J.G. Shin, "Electromagnetic Wave Shielding Heat-Sink Plate Using Carbon Nanotube", Abstract of Korean Patent Publication No. KR2002038035A, filed Nov. 16, 2000, *Derwent*, May 23, 2002, 2 pages.

* cited by examiner

COMPOSITE CARBON NANOTUBE THERMAL INTERFACE DEVICE

CLAIM OF PRIORITY

This application is a divisional of U.S. patent application Ser. No. 10/607,525, filed Jun. 25, 2003, now U.S. Pat. No. 7,112,472.

RELATED APPLICATION

This application is related to application Ser. No. 10/607,390, entitled "Method of Fabricating a Composite Carbon Nanotube Thermal Interface Device", filed on even date herewith Jun. 25, 2003.

FIELD OF THE INVENTION

The invention relates generally to the packaging of an integrated circuit die and, more particularly, to methods for manufacturing a composite carbon nanotube structure that may be used as a thermal interface device.

BACKGROUND OF THE INVENTION

Illustrated in FIG. 1 is a conventional packaged integrated circuit device 100. The integrated circuit (IC) device 100 may, for example, comprise a microprocessor, a network processor, or other processing device, and the IC device 100 may be constructed using flip-chip mounting and Controlled Collapse Chip Connection (or "C4") assembly techniques. The IC device 100 includes a die 110 that is disposed on a substrate 120, this substrate often referred to as the "package substrate." A plurality of bond pads on the die 110 are electrically connected to a corresponding plurality of leads, or "lands", on the substrate 120 by an array of connection elements 130 (e.g., solder balls, columns, etc.). Circuitry on the package substrate 120, in turn, routes the die leads to locations on the substrate 120 where electrical connections can be established with a next-level component (e.g., a motherboard, a computer system, a circuit board, another IC device, etc.). For example, the substrate circuitry may route all signal lines to a pin-grid array 125—or, alternatively, a ball-grid array—formed on a lower surface of the package substrate 120. The pin-grid (or ball-grid) array then electrically couples the die to the next-level component, which includes a mating array of terminals (e.g., pin sockets, bond pads, etc.).

During operation of the IC device 100, heat generated by the die 110 can damage the die if this heat is not transferred away from the die or otherwise dissipated. To remove heat from the die 110, the die is ultimately coupled with a heat sink 170 via a number of thermally conductive components, including a first thermal interface 140, a heat spreader 150, and a second thermal interface 160. The first thermal interface 140 is coupled with an upper surface of the die 110, and this thermal interface conducts heat from the die and to the heat spreader 150. Heat spreader 150 conducts heat laterally within itself to "spread" the heat laterally outwards from the die 110, and the heat spreader 150 also conducts the heat to the second thermal interface 160. The second thermal interface 160 conducts the heat to heat sink 170, which transfers the heat to the ambient environment. Heat sink 170 may include a plurality of fins 172, or other similar features providing increased surface area, to facilitate convection of heat to the surrounding air. The IC device 100 may also include a seal element 180 to seal the die 110 from the operating environment.

The efficient removal of heat from the die 110 depends on the performance of the first and second thermal interfaces 140, 160, as well as the heat spreader 150. As the power dissipation of processing devices increases with each design generation, the thermal performance of these devices becomes even more critical. To efficiently conduct heat away from the die 110 and toward the heat sink 170, the first and second thermal interfaces 140, 160 should efficiently conduct heat in a transverse direction (see arrow 105).

At the first thermal interface, it is known to use a layer of thermal grease disposed between the die 110 and the heat spreader 150. Thermal greases are, however, unsuitable for high power—and, hence, high heat—applications, as these materials lack sufficient thermal conductivity to efficiently remove a substantial heat load. It is also known to use a layer of a low melting point metal alloy (e.g., a solder) as the first thermal interface 140. However, these low melting point alloys are difficult to apply in a thin, uniform layer on the die 110, and these materials may also exhibit low reliability. Examples of materials used at the second thermal interface include thermally conductive epoxies and other thermally conductive polymer materials.

DETAILED DESCRIPTION OF THE INVENTION

Figure 1:
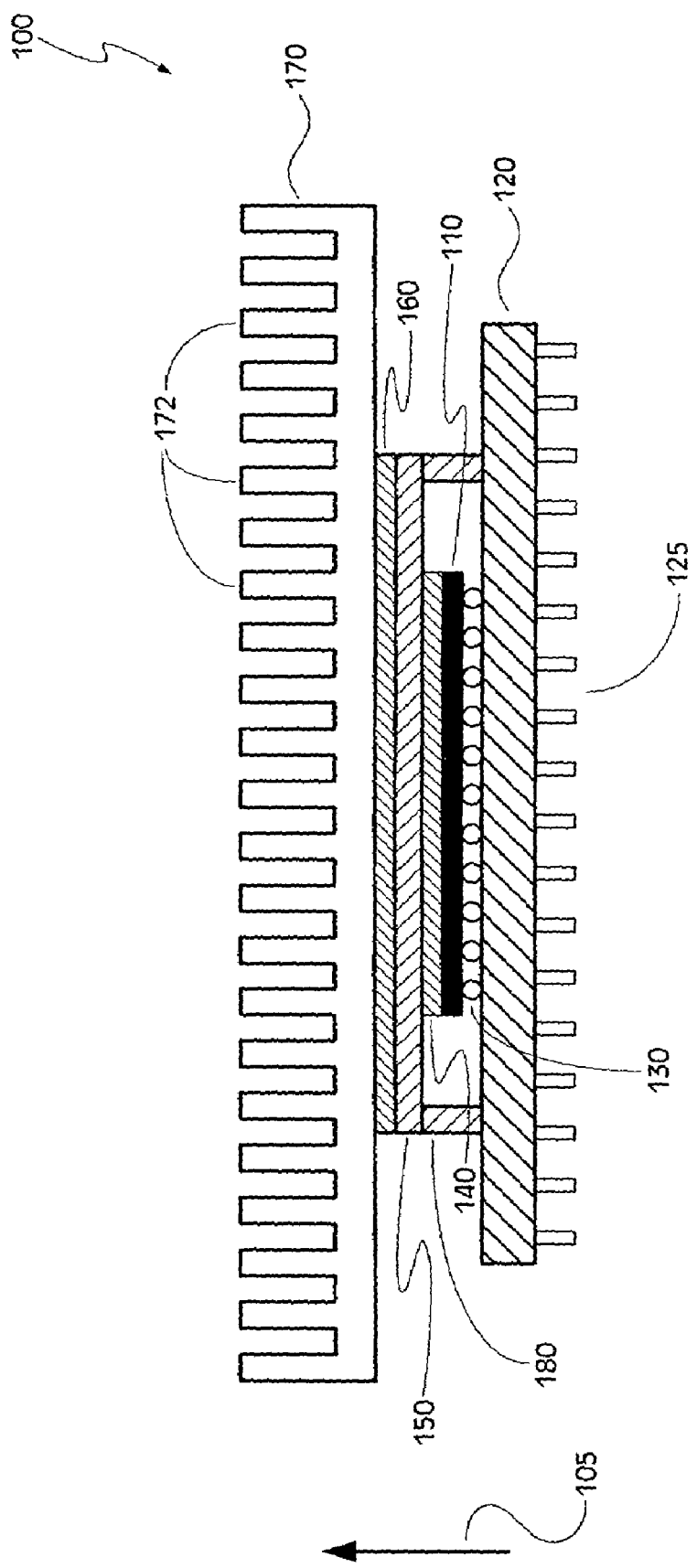
FIG. 1 is a cross-sectional elevation view of a conventional integrated circuit package.

Illustrated in FIGS. 2 through 6F are embodiments of methods for fabricating a composite carbon nanotube structure that may be used as a thermal interface device in an IC device (e.g., the IC device 100 of FIG. 1). In one of the disclosed embodiments, a number of carbon nanotubes are formed in a porous metal oxide layer that has been deposited on a sacrificial substrate. In a second disclosed embodiment, a composite carbon nanotube structure is grown on a substrate using a plating process, wherein carbon nanotubes are dispersed in the plating bath. The disclosed embodiments are explained below in the context of manufacturing thermal interface devices for IC chips; however, it should be understood that the disclosed thermal interface devices and the methods for their production may find application in a wide variety of applications where a thermally conductive element is needed or where a composite carbon nanotubes structure is desired (e.g., field emission displays, data storage devices, as well as other electronic and photonic devices).

Figure 8:
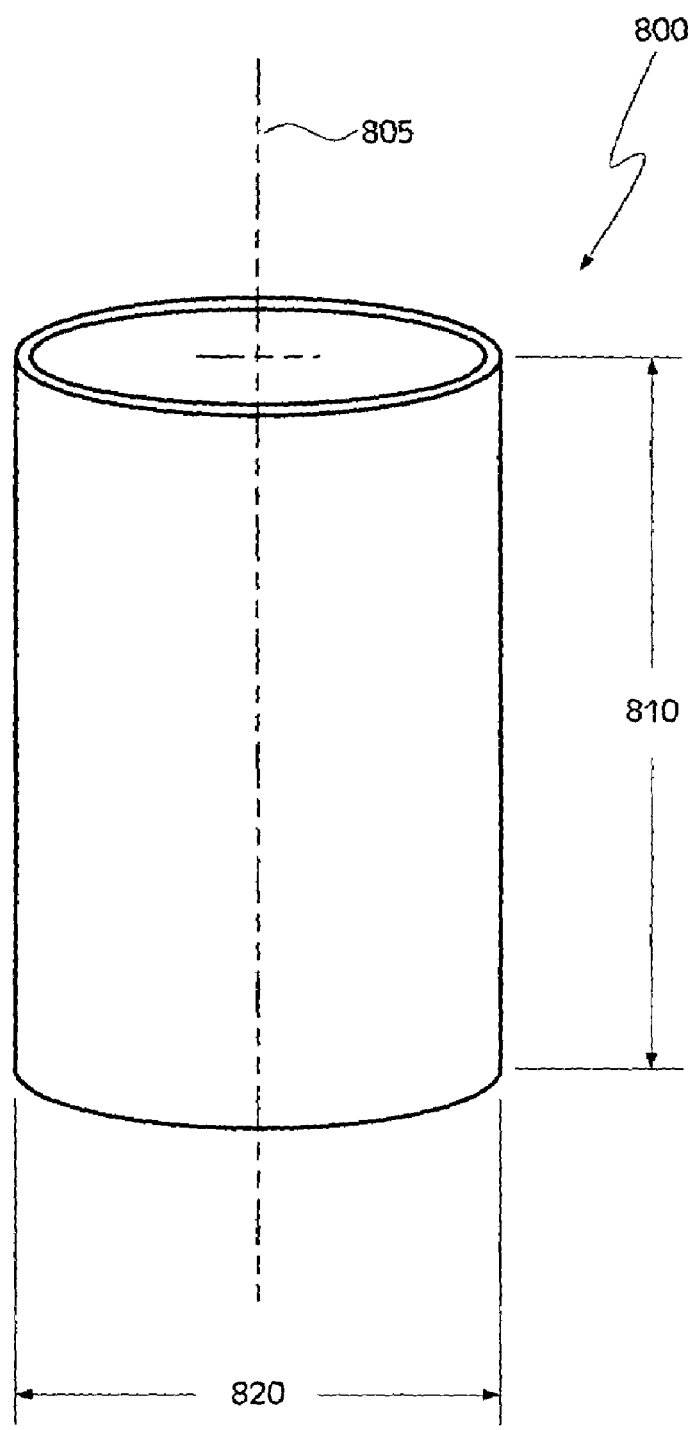
FIG. 8 is a perspective view of an example of a conventional carbon nanotube.

An example of a typical carbon nanotube 800 is shown in FIG. 8. The carbon nanotube (or "CNT") is generally cylindrical in shape and may be single walled or multi-walled. The carbon nanotube 800 extends along a primary axis 805, and the nanotube 800 has a height 810 and a diameter 820. The height 810 may be up to 50 µm in length for a multi-walled carbon nanotube and up to 2 cm in length for a single walled carbon nanotube. For multi-walled carbon nanotubes, the diameter 820 may be up to 100 nm, and for single walled carbon nanotubes, the diameter 820 may be up to 30 nm. Carbon nanotubes are characterized by high mechanical strength, good chemical stability, and high thermal conductivity, especially in a direction along their primary axis 805.

Figure 2:
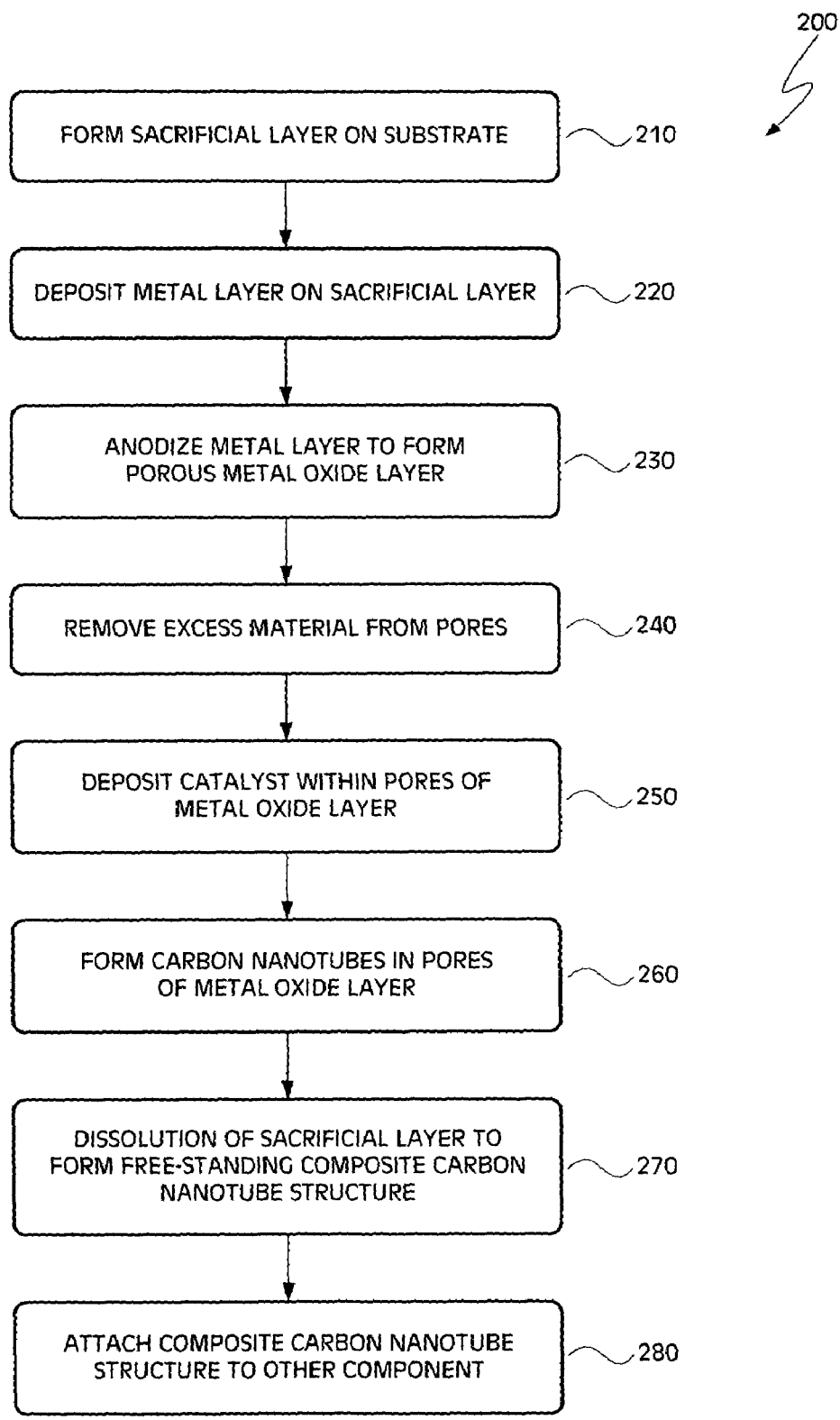
FIG. 2 is a block diagram illustrating one embodiment of a method of fabricating a composite carbon nanotube structure.

Illustrated in FIG. 2 is an embodiment of a method 200 of fabricating a composite carbon nanotube structure comprising an array of carbon nanotubes disposed within a porous metal oxide matrix. Also, the method 200 of FIG. 2 is further illustrated in FIGS. 3A through 3G, as well as FIGS. 4A-4B, and reference should be made to these figures along with FIG. 2, as called out in the text.

Figure 3A:
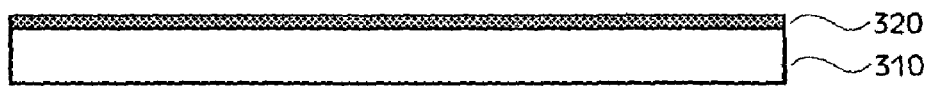
FIGS. 3A-3G are schematic diagrams illustrating an embodiment of the method for fabricating a composite carbon nanotube structure, as shown in FIG. 2.

Referring now to block 210 in FIG. 2, a sacrificial layer is formed on a substrate. This is illustrated in FIG. 3A, where a sacrificial layer 320 has been formed on a substrate 310. The sacrificial layer 320 may comprise any suitable material that will allow for separation of the final composite structure from the substrate 310, as will be described in greater detail below. Materials suitable for the sacrificial layer include, by way of example, Vanadium (V), Titanium (Ti), Tungsten (W), and alloys thereof. The sacrificial layer 320 may be deposited using any suitable deposition technique, including chemical vapor deposition (CVD), physical vapor deposition (PVD) techniques such as sputtering, as well as electroplating and electroless plating.

The substrate 310 may comprise any suitable material upon which a composite carbon nanotube structure can be constructed, such as, for example, a silicon or a ceramic material. As noted above, in one embodiment, the composite carbon nanotube structure to be fabricated on the substrate 310 will ultimately be separated from the substrate. However, in other embodiments, the composite carbon nanotube structure is formed directly on a component, such as an integrated circuit die, a semiconductor wafer, a heat spreader, or a heat sink.

Figure 3B:
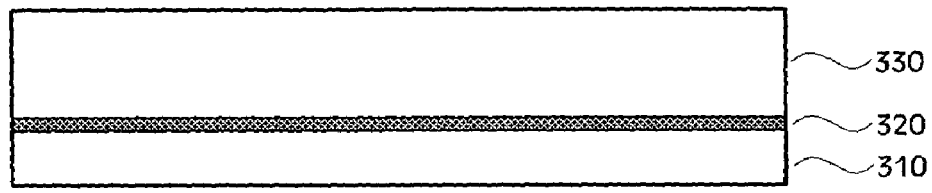

As set forth at block 220, a metal layer is deposited on the sacrificial layer. This is illustrated in FIG. 3B, where a metal layer 330 has been formed on the sacrificial layer 320. In one embodiment, the metal layer 330 comprises Aluminum (Al). However, the metal layer 320 may comprise other suitable metals, including Nickel (Ni) or Silicon (Si). The metal layer 330 may be formed using any suitable deposition technique, including CVD, electroplating, electroless plating, or sputtering.

Figure 3C:
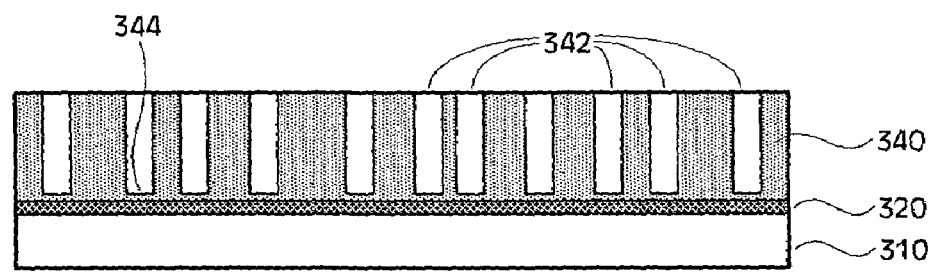

Referring to block 230, the metal layer is anodized to form a porous metal oxide layer. This is shown in FIG. 3C, where the metal layer 330 has been anodized to form a porous metal oxide layer 340, and this metal oxide layer 340 includes a number of pores 342. In one embodiment, where the metal layer 330 comprises Aluminum, the metal oxide layer 340 comprises Aluminum Oxide ($Al_2O_3$). However, it should be understood that the metal oxide layer 340 may comprise an oxide of other metals (e.g., Nickel Oxide, Silicon Oxide). Any suitable anodization process may be employed to anodize the metal layer 330. In one embodiment, the metal layer 330 is anodized in the presence of an acid (e.g., phosphoric acid, succinic acid, sulfuric acid, or oxalic acid) under a positive voltage in a range of between 1 and 60 volts. For Aluminum, as well as other metals, porosity in a range of between approximately 30% and 70% (by volume) can be achieved.

Figure 4B:
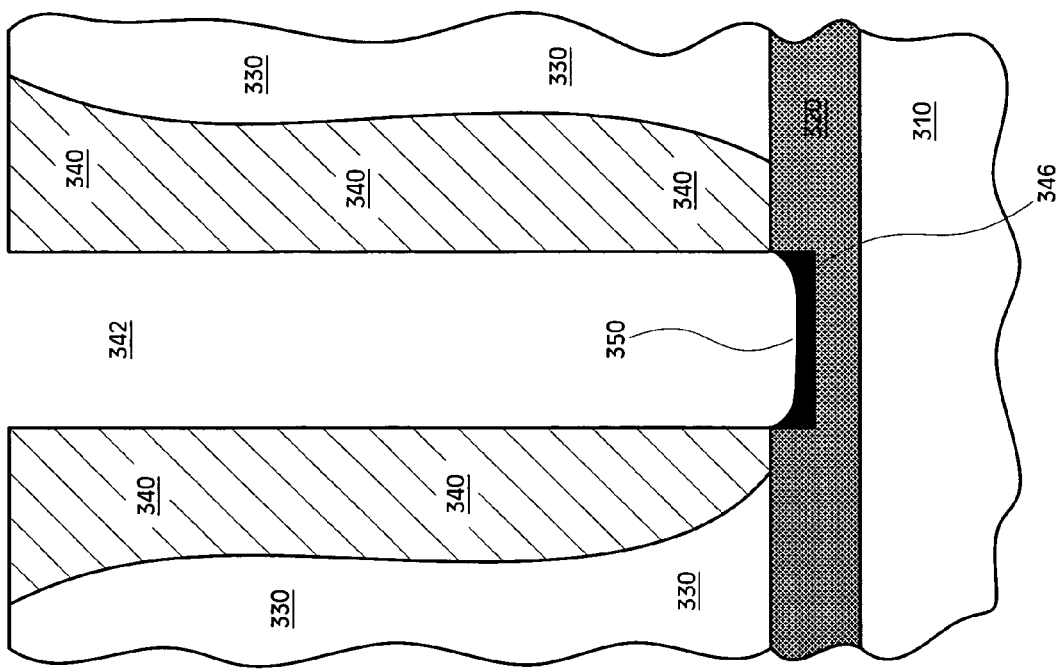
FIGS. 4A-4B are schematic diagrams illustrating further embodiments of the method for fabricating a composite carbon nanotube structure, as shown in FIG. 2.
Figure 4A:
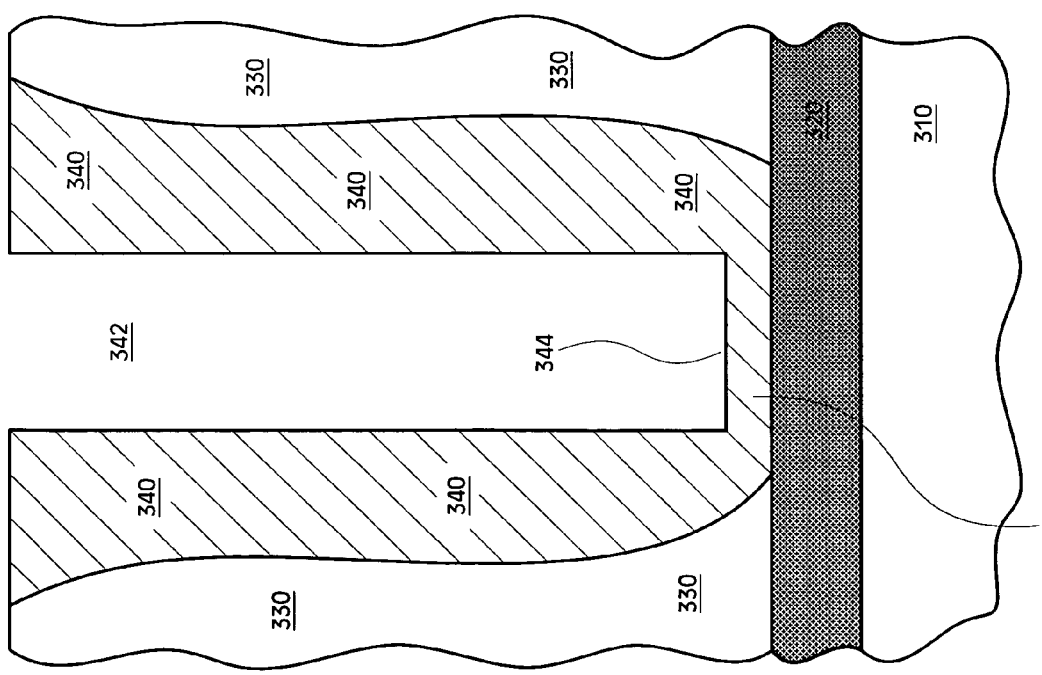

In FIG. 3C, for ease of illustration, the metal layer 330 is represented as being fully anodized to a porous metal oxide layer 340. However, it should be understood that, in practice, only portions of the metal layer 330 may be anodized to form a metal oxide. This is illustrated in FIG. 4A, where portions of the metal layer 330 have been anodized to form metal oxide layer 340 including pores 342, whereas other portions of the metal layer 330 remain unanodized. As shown in FIG. 4A, at least a portion of the metal layer surrounding each pore 342 has been anodized to form a metal oxide 340, and this layer of metal oxide surrounding the pores may be referred to as the "barrier layer."

Figure 3D:
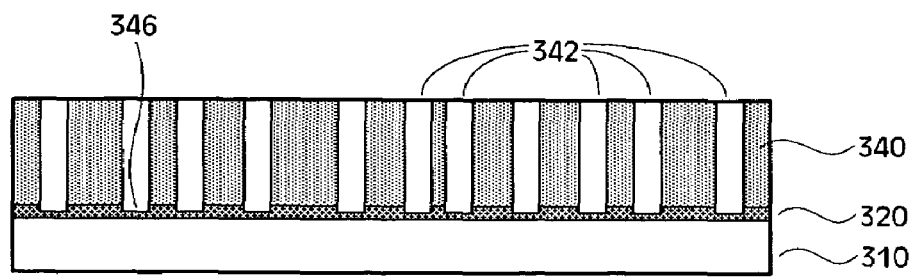

With reference still to FIG. 4A, it can be seen that the bottom ends 344 of the pores 340 (or at least some of the pores) do not extend to the sacrificial layer 320. As will be described below, carbon nanotubes will be grown in the pores 342 of metal oxide layer 340 and, upon separation from the sacrificial layer 320 and substrate 310, carbon nanotubes grown in the pores 342 would not extend through the metal oxide layer 340 (i.e., their ends will be covered by a thin layer 349 of the metal oxide barrier layer). This thin layer of metal oxide remaining on the carbon nanotubes may affect the thermal performance of the resulting composite carbon nanotube structure. Accordingly, as shown at block 240, excess material may be removed from the pores 342 of the metal oxide layer 340. This is illustrated in FIGS. 3D and 4B, where the thin layer 349 of metal oxide has been removed from the lower ends of the pores 340, and the lower ends 346 of the pores 340 (see FIG. 4B) now extend into the sacrificial layer 320 (or at least to the sacrificial layer). Any suitable etching or other material removal process may be employed to remove excess material from the pores.

Returning now to FIG. 2, and block 250 in particular, a catalyst is selectively deposited within the pores 342 of the metal oxide layer 340. This is illustrated in FIG. 4B, where catalyst 350 has been deposited within the pores 342. Note that, as shown in FIG. 4B, the catalyst 350 has been selectively deposited on the exposed portion of the sacrificial layer 320 at the bottom 346 of the pore 340. The catalyst 350 comprises any material upon which growth of a carbon nanotube can be initiated—i.e., the catalyst provides nucleation sites. Suitable catalysts include Iron (Fe), Nickel (Ni), Cobalt (Co), Rhodium (Rh), Platinum (Pt), Yttrium (Yt), and their combinations.

The selective deposition of the catalyst 350 may be achieved using either an electroplating process or an electroless plating process. In an electroplating process, no plating occurs on the exposed metal oxide surfaces within the pores 342 because sufficient electric current will not pass through the dielectric metal oxide. In an electroless plating process, the metal oxide material is not a catalytic material for the plating process, and the catalyst 350 does not build up on exposed metal oxide surfaces. For an electroplating process, the sacrificial layer 320 is comprised of an electrically conductive material and, for an electroless plating process, the sacrificial layer 320 is comprised of a suitable catalytic material (for the catalyst 350).

Figure 3E:
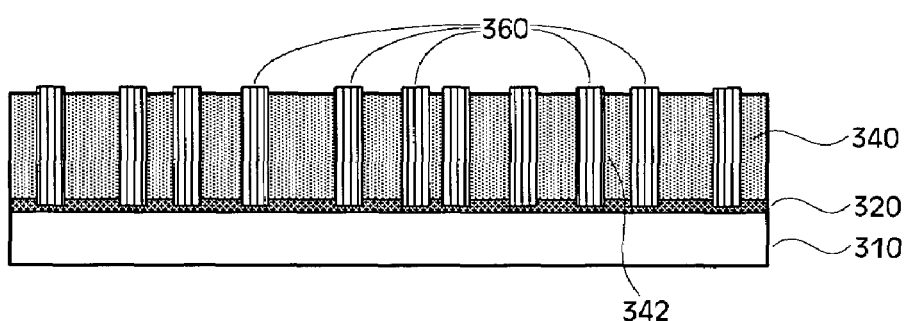

Referring now to block 260, carbon nanotubes are formed in the pores of the metal oxide layer. This is illustrated in FIG. 3E, where carbon nanotubes 360 have been formed in the pores 342 of metal oxide layer 340. The carbon nanotubes will be selectively (or at least preferentially) grown on the catalyst 350 within the pores 342 of metal oxide layer 340, and the carbon nanotubes will align themselves with the pores. Any suitable process may be employed to form the carbon nanotubes 360, including CVD and plasma enhanced CVD (PECVD). Any suitable technique may be used to introduce carbon into the deposition chamber, including introducing a carbon-containing precursor (e.g., methane, ethylene, or acetylene), laser vaporization of carbon, electrical discharge between carbon electrodes, or gas phase CVD using carbon and metal carbonyls. The metal oxide layer 340 (and substrate 310) may also be heated during deposition (e.g., to a temperature of approximately 800° C.).

In one embodiment, as shown in FIG. 3E, the carbon nanotubes 360 may be grown to a height that extends above the upper surface of the metal oxide layer 340. The height of the carbon nanotubes 360 and the extent to which they extend above the upper surface of metal oxide layer 340 is generally a function of the deposition time. Extending the carbon nanotubes 360 above the metal oxide layer 340 may improve the thermal conductivity of the resulting composite carbon nanotube structure by providing improved contact between the carbon nanotubes 360 and any component (e.g., a die, heat spreader, or heat sink) to which they are coupled. In an alternative embodiment, rather than growing the carbon nanotubes 360 to a height above the metal oxide layer 340, an etching process is performed to remove some of the metal oxide material, thereby exposing the ends of the carbon nanotubes.

In the embodiments described above, carbon nanotubes 360 are grown within the pores 342 of a porous metal oxide layer 340. Metal oxides, such as Aluminum Oxide and oxides of other metals, are desirable because they can provide a regular and controlled pore structure. However, it should be understood that the disclosed embodiments are not limited to growth of carbon nanotubes in metal oxide materials. In further embodiments, carbon nanotubes may be grown in other porous substances (e.g., a porous polymer material).

Figure 3F:
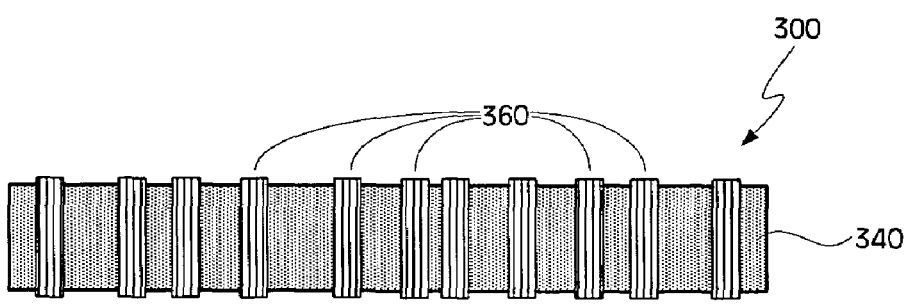

As set forth at block 270, the metal oxide matrix with carbon nanotubes is separated from the substrate to form a free-standing composite carbon nanotube structure. This is shown in FIG. 3F, where the metal oxide layer 340 including carbon nanotubes 360 has been separated from the substrate 310 (and sacrificial layer 320) to form a free-standing composite carbon nanotube structure 300. In one embodiment, this separation is accomplished by dissolution of the sacrificial layer 320. The sacrificial layer 320 may be dissolved in a solution containing an acid (e.g., phosphoric acid, succinic acid, or sulfuric acid). Alternatively, the sacrificial layer 320 may be dissolved in an acid-containing solution in the presence of an anodic potential. The thickness of such a free-standing composite CNT structure 300 may, in one embodiment, be in a range of approximately 2 μm to 20 μm.

Figure 3G:
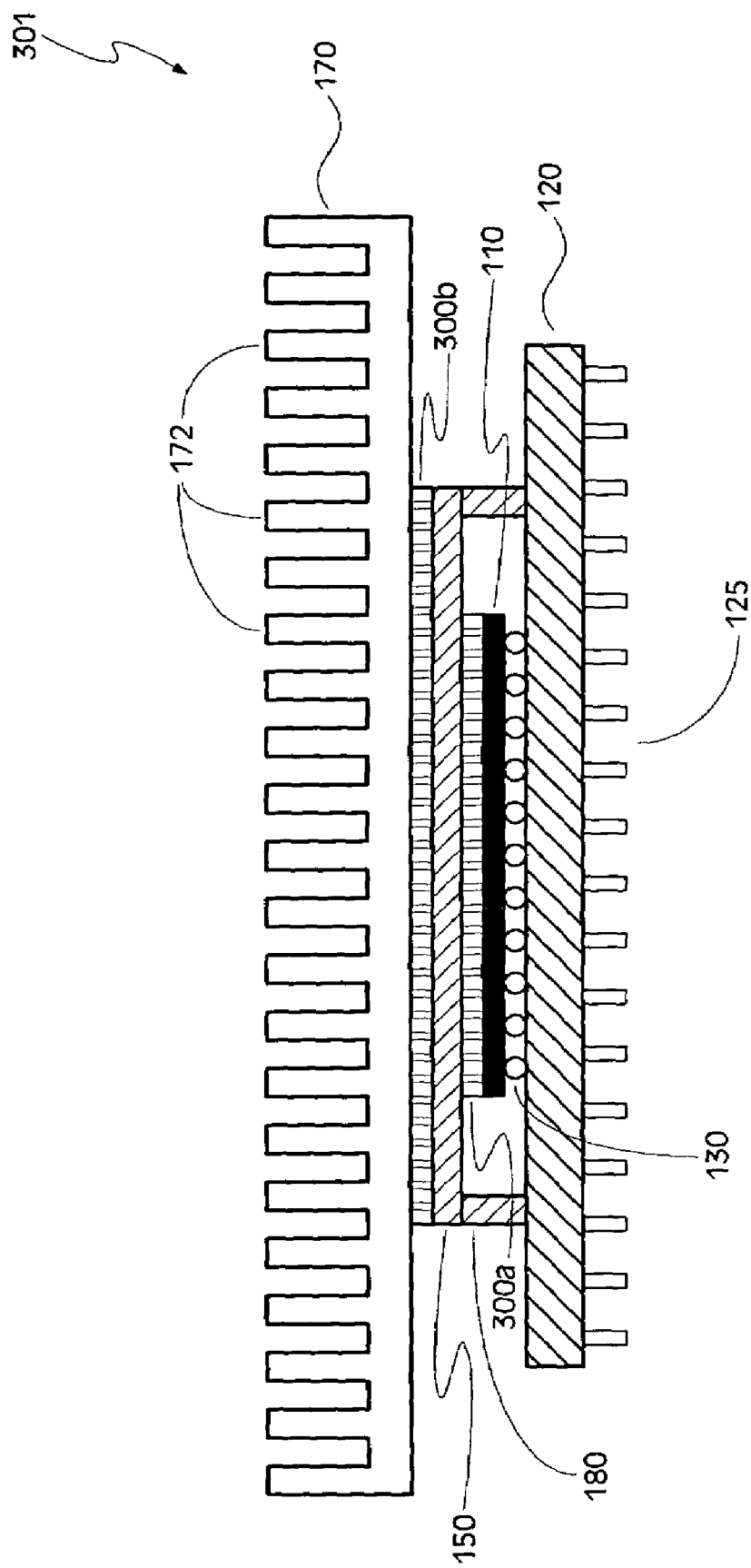

In a further embodiment, as set forth at block 280 in FIG. 2, the free-standing composite carbon nanotube structure is attached to another component (e.g., a die, a heat spreader, a heat sink, etc.). This is illustrated in FIG. 3G, which shows a packaged IC device 301. The packaged IC device 301 includes a first thermal interface device 300a disposed between an integrated circuit die 110 and a heat spreader 150. The IC package 301 may also include another thermal interface device 300b disposed between the heat spreader 150 and a heat sink 170. Each of the thermal interface devices 300a, 300b comprises a free-standing composite CNT structure, as shown in FIG. 3F. Any suitable technique may be used to attach the composite CNT structure 300a (or 300b) to the die 110 and heat spreader 150 (or heat spreader 150 and heat sink 170). In one embodiment, a low melting point metal alloy (e.g., solder) is used to couple the composite CNT structure 300a (or 300b) with each of the die 110 and heat spreader 150 (or heat spreader 150 and heat sink 170), and the composite CNT structure may be mechanically pressed between these components (under, for example, a pressure in a range up to approximately 10 Kg/cm$^2$) to insure sufficient thermal contact is achieved.

Figure 5:
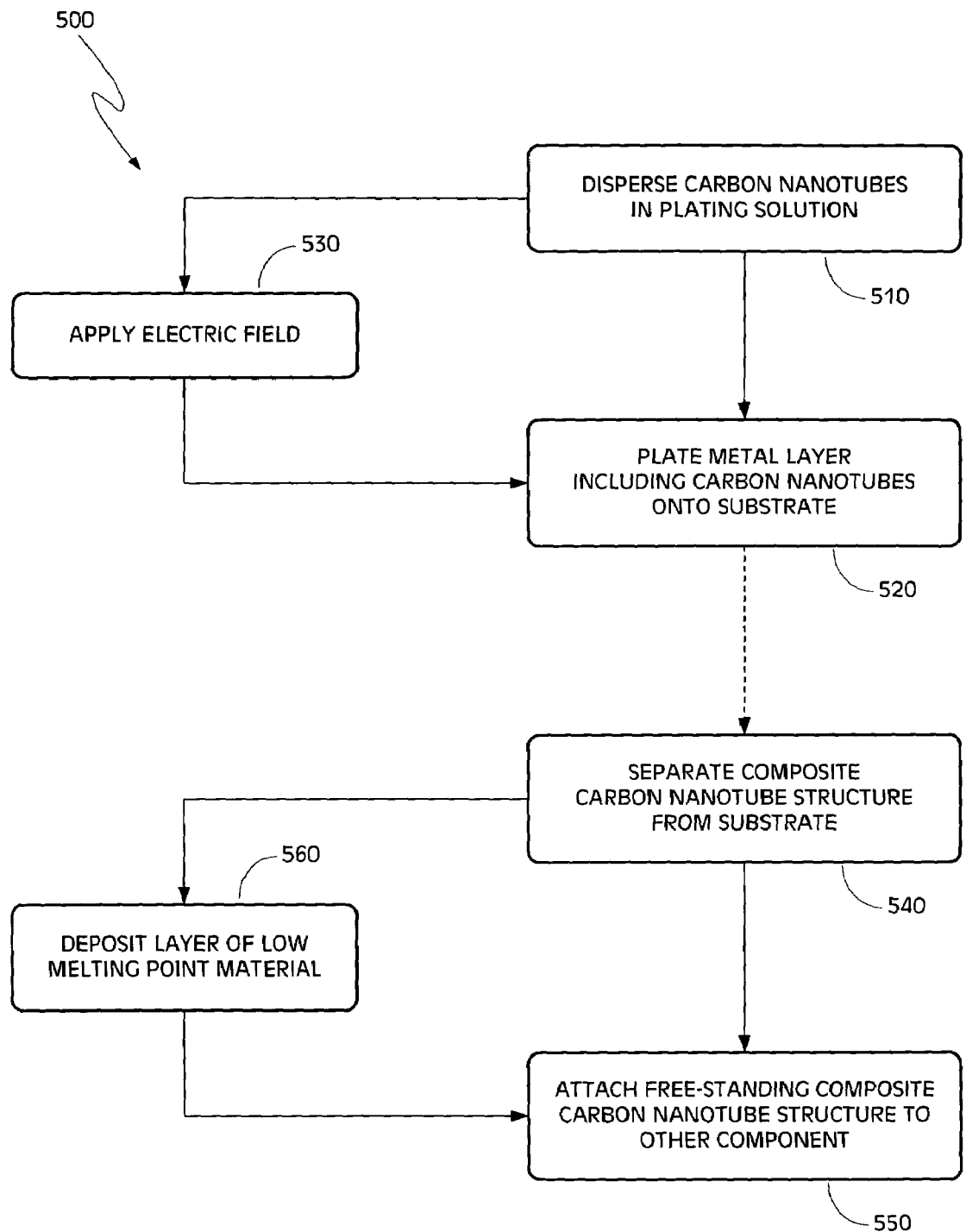
FIG. 5 is a block diagram illustrating a second embodiment of a method of fabricating a composite carbon nanotube structure.

Illustrated in FIG. 5 is a second embodiment of a method 500 of fabricating a composite carbon nanotube structure. Also, the method 500 of FIG. 5 is further illustrated in FIGS. 6A through 6F, and reference should be made to these figures along with FIG. 5, as called out in the text.

Figure 6A:
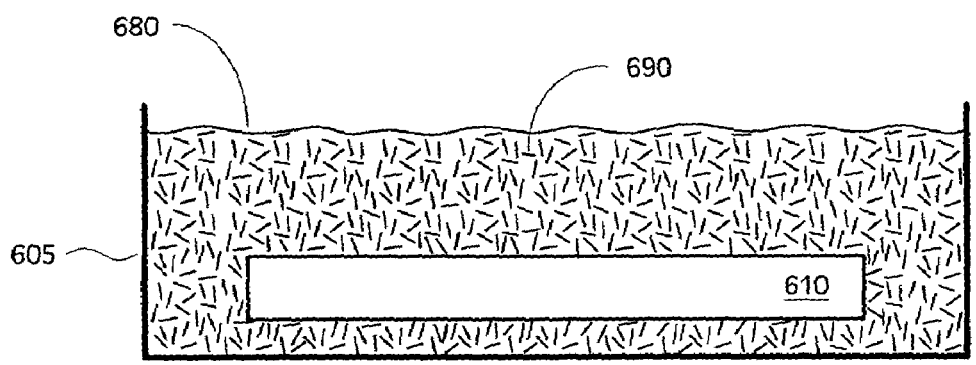
FIGS. 6A-6F are schematic diagrams illustrating an embodiment of the method for fabricating a composite carbon nanotube structure, as shown in FIG. 5.

Referring now to block 510 in FIG. 5, carbon nanotubes are dispersed within a plating solution. This is illustrated in FIG. 6A, where a plating bath 605 includes a plating solution 680 to which carbon nanotubes 690 have been added. In one embodiment, the plating solution 680 is adapted for electroplating, and in another embodiment, the plating solution 680 is adapted for electroless plating. The carbon nanotubes 690 may, in one embodiment, comprise up to approximately 20 percent by weight of the plating solution 680. Also, the solution 680 may be agitated to promote uniform dispersion of the carbon nanotubes 690.

Note that, in FIG. 6A, a substrate 610 has been disposed within the plating bath 605. In one embodiment, the substrate 610 comprises an integrated circuit die. In another embodiment, the substrate 610 comprises a semiconductor wafer upon which integrated circuitry has been formed (that is to be cut into a number of IC die). In a further embodiment, the substrate 610 comprises a heat spreader (e.g., the heat spreader 150 shown in FIG. 1), and in yet another embodiment, the substrate comprises a heat sink (e.g., the heat sink 170 of FIG. 1). In yet a further embodiment, the substrate 610 comprises a sacrificial substrate that is ultimately separated from the structure formed thereon, as will be explained in more detail below.

For electroplating, the plating solution 680 comprises metal ions (of the metal to be plated on substrate 610) and an electrolyte, such as sulfuric acid ($H_2SO_4$) or a base such as KOH (potassium hydroxide) or TMAH (tetramethylammonium hydroxide). The metal to be plated may comprise, by way of example, Tin (Sn), Indium (In), Copper (Cu), Nickel (Ni), Cobalt (Co), Iron (Fe), Cadmium (Cd), Chromium (Cr), Ruthenium (Ru), Rhodium (Rh), Rhenium (Re), Antimony (Sb), Bismuth (Bi), Platinum (Pt), Gold (Au), Silver (Ag), Zinc (Zn), Palladium (Pd), Manganese (Mn), or alloys thereof. In another embodiment, the plating solution 680 further comprises a complexing agent to complex ions in the plating solution in order to change their solubility and oxidation/reduction potential. For example, for Cobalt metal ions, citric acid can be used as the complexing agent to make the Cobalt ions soluble in a basic (high pH) solution. In a further embodiment, the plating solution 680 also includes one or more additives to regulate the material properties of the plated metal (e.g., polyethylene glycol or di-sulfides to regulate grain size).

For electroless plating, the plating solution comprises metal ions (again, of the metal to be plated on substrate 610), one or more complexing agents, and one or more reducing agents. As set forth previously, the metal to be plated may comprise Tin, Indium, Copper, Nickel, Cobalt, Iron, Cadmium, Chromium, Ruthenium, Rhodium, Rhenium, Antimony, Bismuth, Platinum, Gold, Silver, Zinc, Palladium, Manganese, or alloys thereof. Also as noted above, a complexing agent comprises a substance to complex ions in the plating solution in order to change their solubility and oxidation/reduction potential (see example above). The reducing agent (or agents) comprises any substance that will supply electrons to the plating bath 680 during the plating process, including formaldehyde, hypophosphite, dimethyl amine borane, or hydrazine hydrate. In another embodiment, the plating solution 680 also includes a substance to adjust the pH of the plating solution. In a further embodiment, the plating solution also includes one or more additives to regulate the properties of the deposited metal, as described above.

Figure 6B:
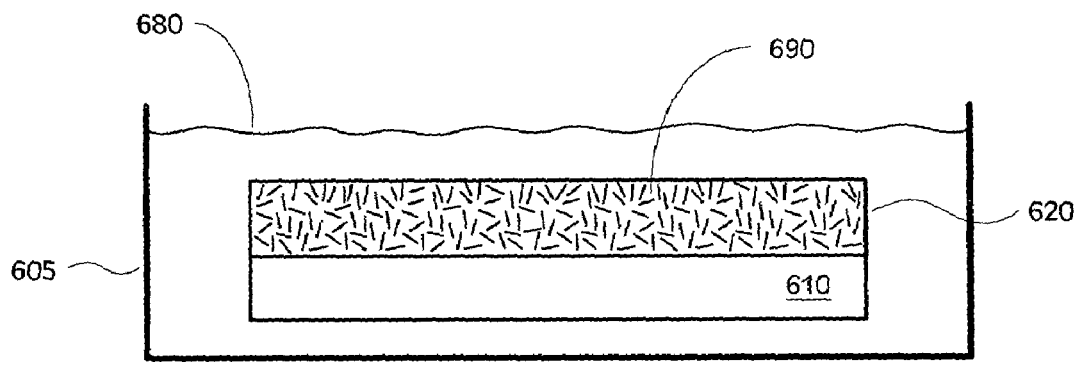

Referring next to block 520, a layer of metal is plated on the substrate, wherein this metal layer includes carbon nanotubes from the plating bath. This is illustrated in FIG. 6B, where a metal layer 620 has been formed on the substrate 610, and this metal layer 620 includes a number of carbon nanotubes 690. Thus, a metal matrix 620 having carbon nanotubes 690 dispersed therein is formed on the substrate 610. The carbon nanotubes 690 in metal layer 620 originate from the plating solution 680, and they are deposited on the substrate 610 along with the metal layer 620 during the plating process. Note that, in FIG. 6B (and FIG. 6C), the carbon nanotubes 690 are not shown in the plating solution 680 (although present in this solution), which has been done simply for clarity and ease of illustration.

Figure 6C:
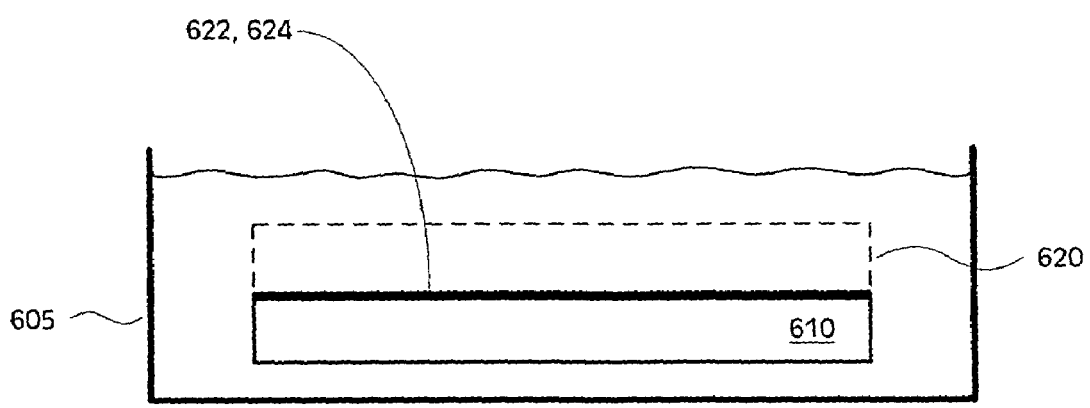

The metal layer 620 may be deposited on the substrate using an electroplating process or an electroless plating process. For electroplating, in one embodiment, a seed layer may first be deposited on the substrate 610 prior to deposition of the metal layer 620. This is shown in FIG. 6C, where a seed layer 622 has been formed on the substrate 610. The seed layer 622 will typically comprise the same metal that is to be plated on the substrate 610 (although the seed layer may be a different metal), and this seed layer 622 may be deposited using any suitable process (e.g., CVD). For electroless plating, a layer of catalyst 624 (also shown in FIG. 6C) may, in one embodiment, be deposited on the substrate 610 prior to plating. The catalyst layer may comprise a noble metal—e.g., Gold (Au), Palladium (Pd), Platinum (Pt), Ruthenium (Ru), Rhodium (Rh), Silver (Ag), Osmium (Os), or Iridium (Ir)—or a transition metal—e.g., Nickel (Ni), Cobalt (Co), or Iron (Fe)—or their alloys, and this layer may be deposited using any suitable process (e.g., CVD). Also, for electroplating, the plating solution 680 is typically maintained at room temperature, whereas for electroless plating, the plating solution 680 in plating bath 605 may be heated.

Figure 6D:
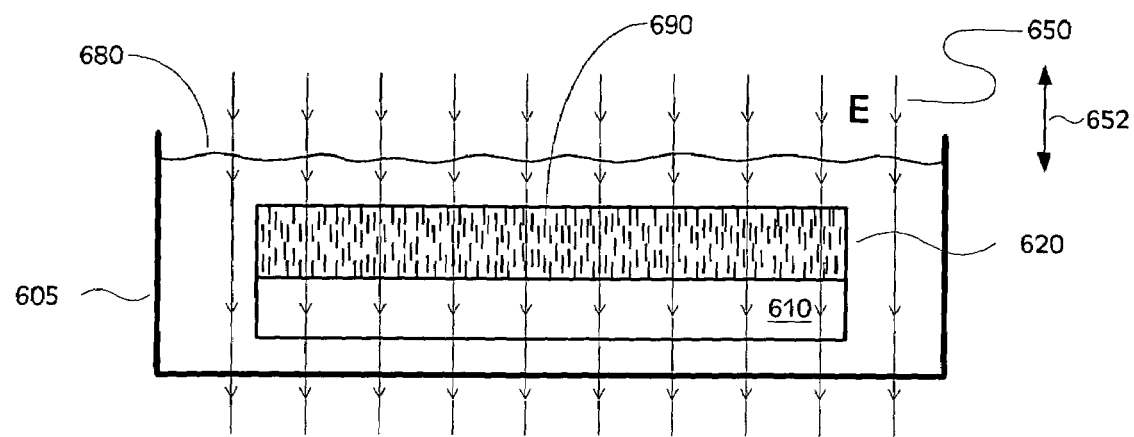

In one alternative embodiment, as set forth at block 530 in FIG. 5, an electric field is applied across the substrate during formation of the metal layer. This is illustrated in FIG. 6D, where an electric field (E) 650 is applied across the substrate 610. Any suitable device may be employed to apply the electric field 650 across the substrate 610. For example, the substrate 610 may be disposed between two plates, wherein a voltage is applied between the two plates to create an electric field (similar to a parallel plate capacitor). In the presence of an electric field, a carbon nanotube will align itself with the electric field—i.e., the primary axis 705 (see FIG. 7) of the carbon nanotubes will align in the direction of the electric field 650 (see arrow 652)—and this alignment will be maintained during the plating process. In one embodiment, an electric field having a strength of approximately 10,000 V/cm is applied to align the carbon nanotubes; however, it should be understood that an electric field of any suitable strength may be applied, so long as the field induces the desired degree of alignment. As noted above, carbon nanotubes are excellent thermal conductors along their primary axis, and alignment of the carbon nanotubes 690 in a direction parallel (or at least substantially parallel) with the electric filed 650 will produce a metal matrix with carbon nanotubes that has a high thermal conductivity in the direction of alignment (again, see arrow 652).

Figure 6E:

In another embodiment, where the substrate 610 comprises a sacrificial substrate, the metal matrix layer 620 with carbon nanotubes 690 is separated from the substrate, as denoted at block 540. This is shown in FIG. 6E, where the metal matrix layer 620 with carbon nanotubes 690 has been separated from the substrate 610 to form a free-standing composite carbon nanotube structure 600. In one embodiment, the thickness of this free-standing composite CNT structure 600 may be in a range of 2 μm to 20 μm.

Figure 6F:
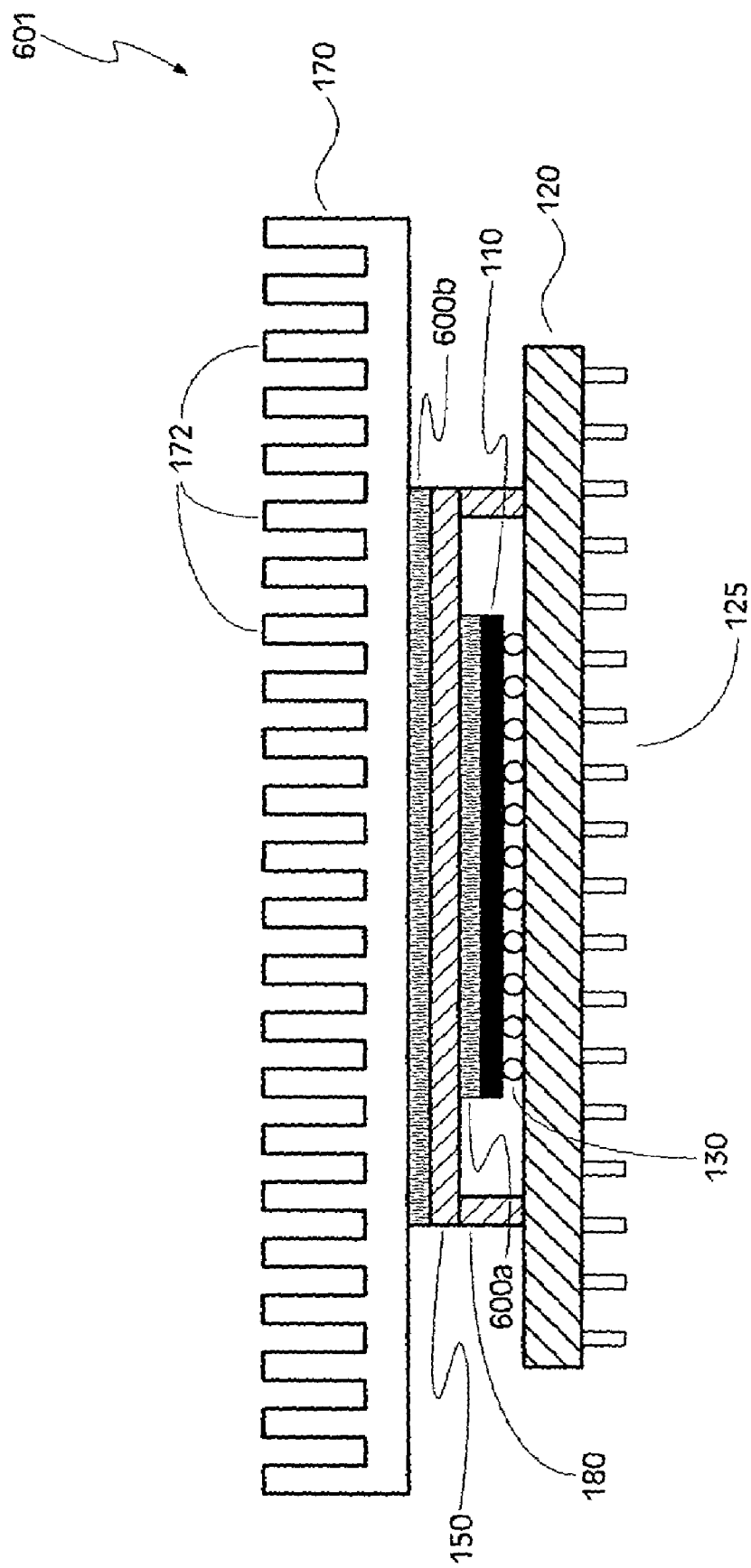

In a further embodiment, the free-standing composite carbon nanotube structure 600 is attached to another component (e.g., a die, a heat spreader, a heat sink,—etc.). This is illustrated in FIG. 6F, which shows a packaged IC device 601. The packaged IC device 601 includes a first thermal interface device 600a disposed between an integrated circuit die 110 and a heat spreader 150. The IC package 601 may also include another thermal interface device 600b disposed between the heat spreader 150 and a heat sink 170. Each of the thermal interface devices 600a, 600b comprises a free-standing composite CNT structure, as shown in FIG. 6E. Any suitable technique may be used to attach the composite CNT structure 600a (or 600b) to the die 110 and heat spreader 150 (or heat spreader 150 and heat sink 170). In one embodiment, a low melting point metal alloy (e.g., solder) is deposited on a surface (or surfaces) of the composite CNT structure—see block 560 in FIG. 5—and this layer of low melting point alloy is used to couple the composite CNT structure 600a (or 600b) with the die 110 and/or heat spreader 150 (or heat spreader 150 and/or heat sink 170). In another embodiment, the plated metal 620 itself comprises a low melting point metal or alloy, and attachment to the die 110 and/or heat spreader 150 (or heat spreader 150 and/or heat sink 170) is accomplished by re-melting the metal matrix layer 620.

An IC device having a thermal interface comprising a free-standing composite CNT structure—e.g., the packaged IC device 301 of FIG. 3G having thermal interface devices 300a, 300b, or the packaged IC device 601 of FIG. 6F having thermal interface devices 600a, 600b—may find application in any type of computing system or device. An embodiment of such a computer system is illustrated in FIG. 7.

Figure 7:
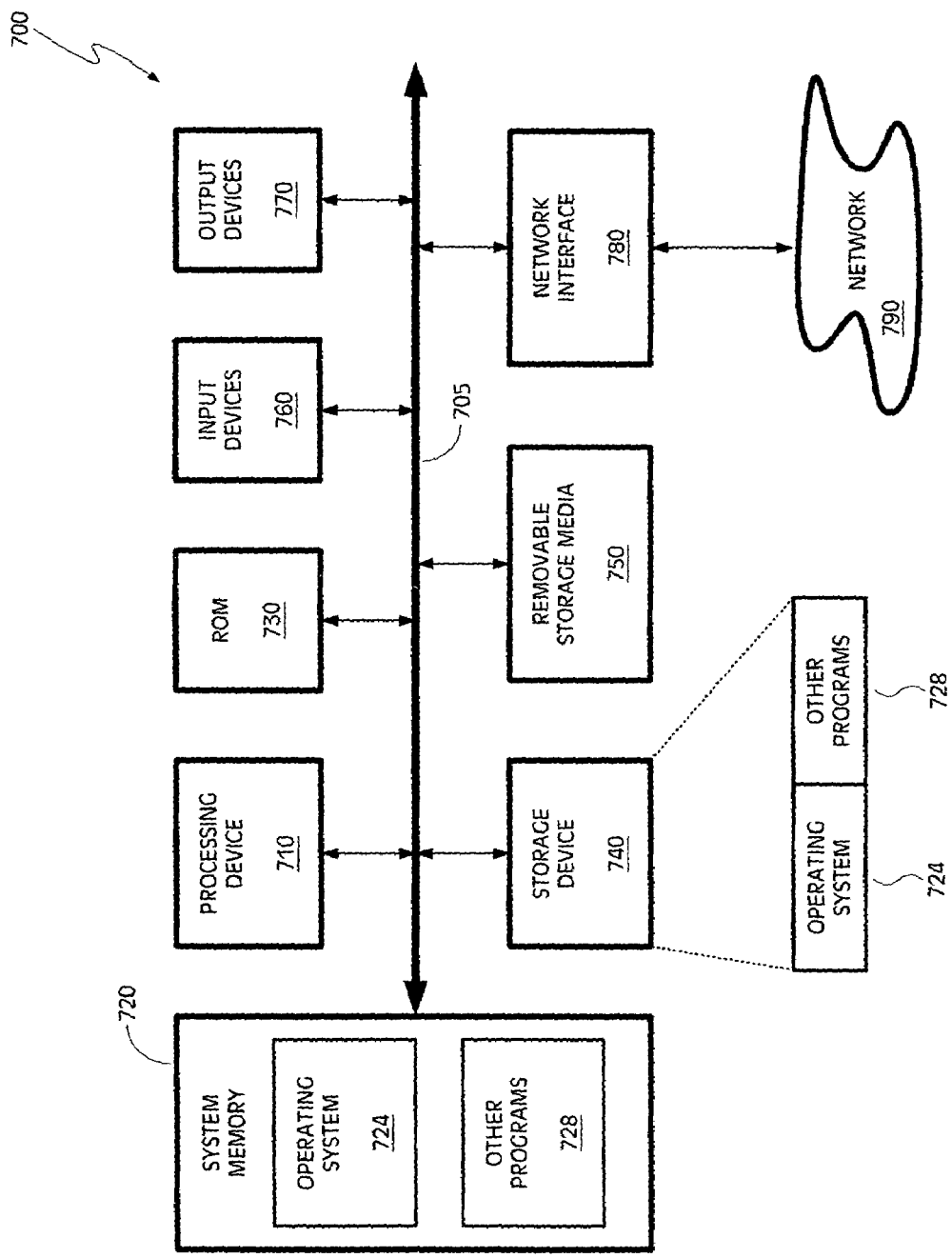
FIG. 7 is a schematic diagram of a computer system including an integrated circuit device having a composite carbon nanotube structure constructed according to the method of FIG. 2 or the method of FIG. 5.

Referring to FIG. 7, the computer system 700 includes a bus 705 to which various components are coupled. Bus 705 is intended to represent a collection of one or more buses—e.g., a system bus, a Peripheral Component Interface (PCI) bus, a Small Computer System Interface (SCSI) bus, etc.—that interconnect the components of computer system 700. Representation of these buses as a single bus 705 is provided for ease of understanding, and it should be understood that the computer system 700 is not so limited. Those of ordinary skill in the art will appreciate that the computer system 700 may have any suitable bus architecture and may include any number and combination of buses.

Coupled with bus 705 is a processing device (or devices) 710. The processing device 710 may comprise any suitable processing device or system, including a microprocessor, a network processor, an application specific integrated circuit (ASIC), or a field programmable gate array (FPGA), or similar device. In one embodiment, the processing device 710 comprises an IC device including a free-standing composite CNT structure (e.g., packaged IC device 301 having thermal interface devices 300a, 300b, or packaged IC device 601 having thermal interface devices 600a, 600b). However, it should be understood that the disclosed thermal interface devices comprising a composite CNT structure may find use in other types of IC devices (e.g., memory devices).

Computer system 700 also includes system memory 720 coupled with bus 705, the system memory 720 comprising, for example, any suitable type of random access memory (e.g., dynamic random access memory, or DRAM). During operation of computer system 700 an operating system 724, as well as other programs 728, may be resident in the system memory 720. Computer system 700 may further include a read-only memory (ROM) 730 coupled with the bus 705. During operation, the ROM 730 may store temporary instructions and variables for processing device 710, and ROM 730 may also have resident thereon a system BIOS (Basic Input/Output System). The computer system 700 may also include a storage device 740 coupled with the bus 705. The storage device 740 comprises any suitable non-volatile memory—such as, for example, a hard disk drive—and the operating system 724 and other programs 728 may be stored in the storage device 740. Further, a device 750 for accessing removable storage media (e.g., a floppy disk drive or CD ROM drive) may be coupled with bus 705.

The computer system 700 may include one or more input devices 760 coupled with the bus 705. Common input devices 760 include keyboards, pointing devices such as a mouse, and scanners or other data entry devices. One or more output devices 770 may also be coupled with the bus 705. Common output devices 770 include video monitors, printing devices, and audio output devices (e.g., a sound card and speakers). Computer system 700 further comprises a network interface 780 coupled with bus 705. The network interface 780 comprises any suitable hardware, software, or combination of hardware and software capable of coupling the computer system 700 with a network (or networks) 790.

It should be understood that the computer system 700 illustrated in FIG. 7 is intended to represent an exemplary embodiment of such a computer system and, further, that this computer system may include many additional components, which have been omitted for clarity and ease of understanding. By way of example, the computer system 700 may include a DMA (direct memory access) controller, a chip set associated with the processing device 710, additional memory (e.g., a cache memory), as well as additional signal lines and buses. Also, it should be understood that the computer system 700 may not include all of the components shown in FIG. 7.

Embodiments of a methods 200, 500 for fabricating composite carbon nanotube structures 300, 600—as well as embodiments of a thermal interface device comprising such a composite CNT structure—having been herein described, those of ordinary skill in the art will appreciate the advantages of the disclosed embodiments. The disclosed composite CNT structures provides high thermal conductivity, high mechanical strength, and good chemical stability. Further, these composite CNT structures may be fabricated to a very thin and uniform thickness. Also, the disclosed composite CNT structures may be fabricated using well known, low cost methods (e.g., CVD, PECVD, electroplating, electroless plating, sputtering, etc.), and their fabrication and use as thermal interface devices is compatible with existing assembly and process conditions.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A device comprising:
    an integrated circuit die; and
    a thermal interface device coupled with a surface of the die, the thermal interface device comprising a layer of a porous metal oxide, the layer comprising a first surface and an opposing second surface, and a number of carbon nanotubes disposed in pores of the porous metal oxide layer, the carbon nanotubes extending beyond the first surface and the second surface of the porous metal oxide layer.

2. The device of claim 1, further comprising a heat spreader coupled with the thermal interface device.

3. The device of claim 2, further comprising:
    a second thermal interface device coupled with the heat spreader, the second thermal interface device comprising a layer of a porous metal oxide and a number of carbon nanotubes disposed in pores of the porous metal oxide layer; and
    a heat sink coupled with the second thermal interface device.

4. A system comprising:
    a bus; and
    a device coupled with the bus, the device including
        an integrated circuit die, and
        a thermal interface device coupled with a surface of the die, the thermal interface device comprising a layer of a porous metal oxide having a first surface and an opposing second surface and a number of carbon nanotubes disposed in pores of the porous metal oxide layer whereby at least some of the carbon nanotubes extend beyond the first surface of the porous metal oxide layer, and at least some of the carbon nanotubes extend beyond the second surface of the porous metal oxide layer.

5. The system of claim 4, wherein the device further includes a heat spreader coupled with the thermal interface device.

6. The system of claim 5, wherein the device further includes:
    a second thermal interface device coupled with the heat spreader, the second thermal interface device comprising a layer of a porous metal oxide and a number of carbon nanotubes disposed in pores of the porous metal oxide layer; and
    a heat sink coupled with the second thermal interface device.

7. The system of claim 4, wherein the device comprises a processing device.

8. The system of claim 7, further comprising a memory coupled with the bus.

\* \* \* \* \*